United States Patent [19]

Uehara et al.

[11] Patent Number: 5,017,146

[45] Date of Patent: May 21, 1991

[54] STRUCTURE FOR COUPLING PLURAL SUBSTRATES

[75] Inventors: Yukiyasu Uehara; Kazuhiko Migita, both of Tokyo, Japan

[73] Assignee: Clarion Co., Ltd., Tokyo, Japan

[21] Appl. No.: 499,950

[22] Filed: Mar. 27, 1990

[51] Int. Cl.[5] .............................................. H05K 1/00
[52] U.S. Cl. ......................................... 439/65; 439/60
[58] Field of Search ....................... 439/59, 60, 61, 62, 439/65, 79, 80, 74

[56] References Cited

U.S. PATENT DOCUMENTS

| 4,818,239 | 4/1989 | Erk | 439/79 |
| 4,859,191 | 8/1989 | Tonooka et al. | 439/79 |
| 4,907,977 | 3/1990 | Porter | 439/74 |
| 4,934,941 | 6/1990 | Okada | 439/65 |

Primary Examiner—David L. Pirlot
Assistant Examiner—Julie R. Daulton
Attorney, Agent, or Firm—Flynn, Thiel, Boutell & Tanis

[57] ABSTRACT

A structure for coupling a plurality of substrates includes at least two transverse parallel substrates on which connectors are fixed so that their coupling motion is effected perpendicularly of major surfaces of the substrate. The structure further includes a longitudinal substrate on which connectors are fixed at front and rear different positions so that their coupling motion is effected in a parallel direction with a major surface of the substrate. When the longitudinal substrate is mounted to the transverse substrates, with their connectors being coupled together, structural and electrical connection between the longitudinal substrate and the transverse substrates is established simultaneously.

1 Claim, 10 Drawing Sheets

STRUCTURE FOR COUPLING PLURAL SUBSTRATES

BACKGROUND OF THE INVENTION

1. Field of the Invention

This invention relates to a structure for coupling a plurality of substrates, using connectors, and more particularly to a structure for connecting in a one-shot fashion at least two parallely disposed substrates with a substrate disposed substantially perpendicularly of the former substrates, using connectors.

2. Description of the Prior Art

In order to connect a plurality of substrates which are disposed in a perpendicular relationship in an electronic device for exchange of electric signals therebetween, a conventional process uses coupling members provided between the substrates.

Figure 9:
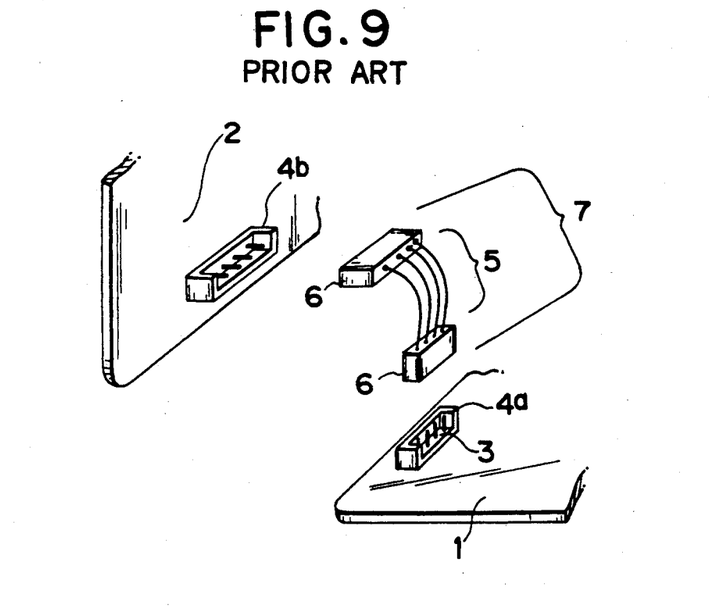
FIG. 9 is a fragmentary view of a first conventional structure.

Such a conventional substrate coupling structure is shown in FIG. 9. A transverse substrate 1 and a longitudinal substrate 2 make a right angle. Plugs (convex connector) 4a and 4b each having a plurality of coupling terminals 3 are supported on the substrates 1 and 2, respectively. A coupling member 7 includes a plurality of lead wires 5 in association with the coupling terminals 3 of the plugs 4a and 4b and includes sockets (concave connectors) 6 provided at opposite ends of the lead wires 5.

One of the sockets 6 of the coupling member 7 is inserted in the plug 4a of the transverse substrate 1, and the other socket 6 is inserted in the plug 4b of the longitudinal substrate 2, thereby to electrically connect two substrates 1 and 2.

This coupling process, however, requires two separate working steps, namely, first positioning the substrates 1 and 2 and subsequently connecting the substrates 1 and 2, and therefore invites an increase of the manufacturing processes. Further, the use of the coupling member 7 results in an increase in the number of parts or elements of the entire structure, and requires the parts an additional assembling process.

Figure 10A:
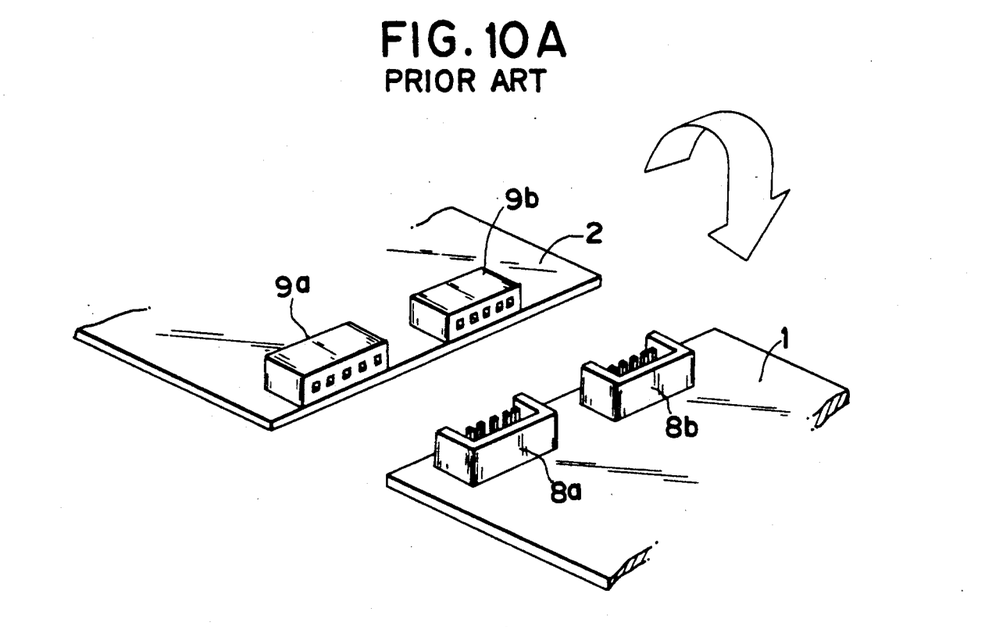
FIG. 10A is a view which shows a substrate coupling process of a second conventional structure.
Figure 10B:
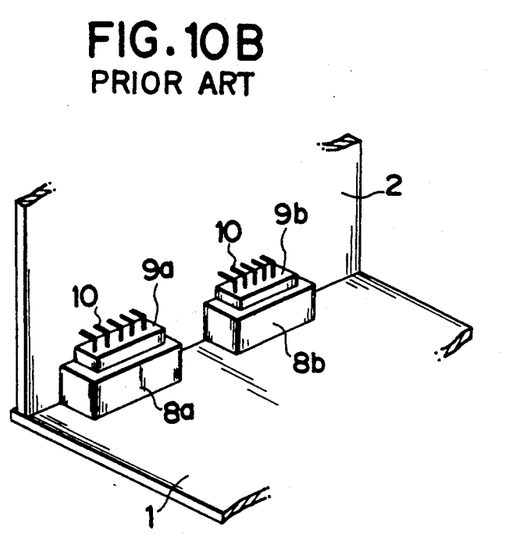
FIG. 10B is a fragmentary perspective view which shows substrates connected by the process of the second conventional structure.

For purposes of overcoming the drawbacks of the above-described substrate coupling structure, another substrate coupling structure has been proposed as shown in FIGS. 10A and 10B.

Referring to FIGS. 10A and 10B, the transverse substrate 1 has plugs 8a and 8b mounted at an end portion thereof and facing in a perpendicular direction with respect to the substrate surface. The transverse substrate 2 has sockets 9a and 9b mounted at the lower end portion thereof and facing in a parallel direction with the substrate surface so as to be connected with the plugs 8a and 8b. The sockets 9a and 9b are connected to the longitudinal substrate 2 by a plurality of terminals 10.

In the substrate coupling structure, by turning the vertical substrate 2 in the arrow-marked direction and pushing it onto the horizontal substrate 1 downwardly, the plugs 8a and 8b are inserted in the sockets 9a and 9b simultaneously with assemblage of the substrates as shown in FIG. 9B, and electrical connection between the substrates 1 and 2 is readily established.

Figure 11:
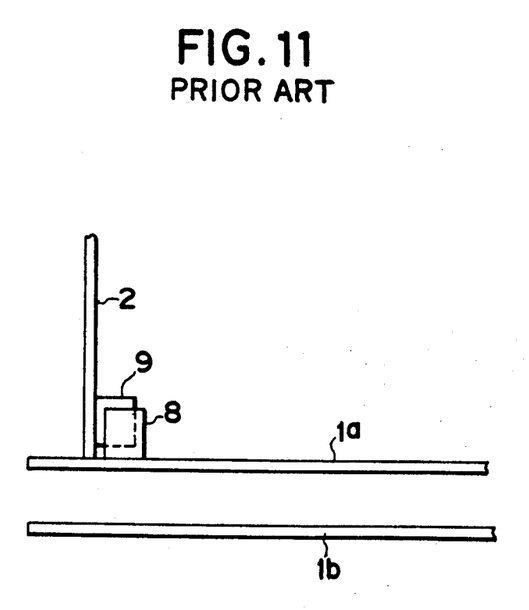
FIG. 11 is a fragmentary side elevation of a third conventional structure.

In recent years, however, high density arrangement of a large number of circuit elements is required in such a way as shown in FIG. 11 where transverse substrates 1a and 1b are mounted in a close multi-step relationship. In this case, the coupling process shown in FIGS. 10A and 10B, although acceptable for electrical connection between the upper transverse substrate 1a and the longitudinal substrate 2, is not effective for the lower transverse substrate 1b, and it is forced to use the coupling member 7 as shown in FIG. 9.

A substrate coupling structure according to the invention overcomes the above-indicated problems involved in the conventional structures.

SUMMARY OF THE INVENTION

Accordingly, the primary feature of the invention is that a structure for coupling a plurality of substrates comprises: a first transverse substrate and a second transverse substrate disposed above and parallel to said first transverse substrate;

a first transverse substrate connector fixed on an upper surface of said first transverse substrate so that a coupling motion of said first transverse substrate connector is effected in a perpendicular direction of said upper surface of said first transverse substrate;

a cutout or aperture formed in said second transverse substrate to permit said coupling motion of said first transverse substrate connector;

a second transverse substrate connector fixed on an upper surface of said second transverse substrate at a position aligned with said first transverse substrate connector on a line along their length direction so that a coupling motion of said second transverse substrate connector is effected in a perpendicular direction of said upper surface of said second transverse substrate;

a longitudinal substrate to be mounted perpendicularly with respect to said first and second transverse substrates;

a front longitudinal substrate connector fixed on an upper surface of said longitudinal substrate so that a coupling motion of said front longitudinal substrate connector is effected in a parallel direction with said upper surface of said longitudinal substrate, said front longitudinal substrate connector being coupled to said first transverse substrate connector; and a rear longitudinal substrate connector fixed on said upper surface of said longitudinal substrate at a position behind said front longitudinal substrate connector so that a coupling motion of said rear longitudinal substrate connector is effected in a parallel direction with said upper surface of said longitudinal substrate, said rear longitudinal substrate connector being coupled to said second transverse substrate connector.

These and other features of this invention will be readily apparent from the following specification and the drawings.

DETAILED DESCRIPTION

A first embodiment of the invention is explained below, referring to FIGS. 1A to 6. In these drawings are used the same reference numerals as those used in the explanation of the conventional structures to indicate equivalent parts or members, and their explanation is omitted unless it is needed specifically.

Figure 1A:
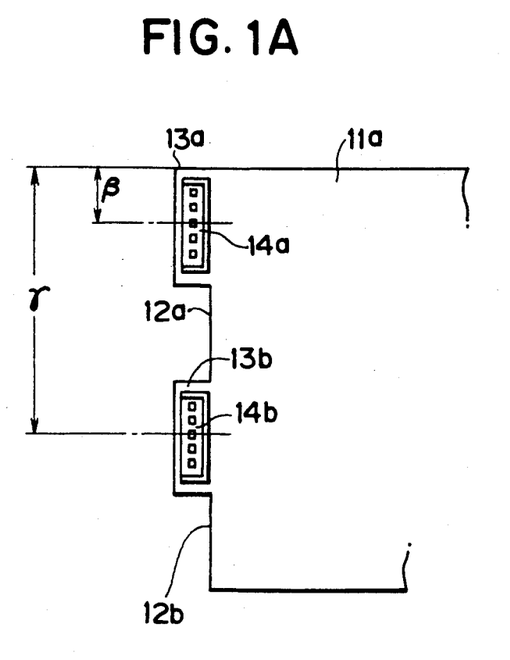
FIG. 1A is a fragmentary plan view of an upper substrate of a first embodiment of the invention.
Figure 1B:
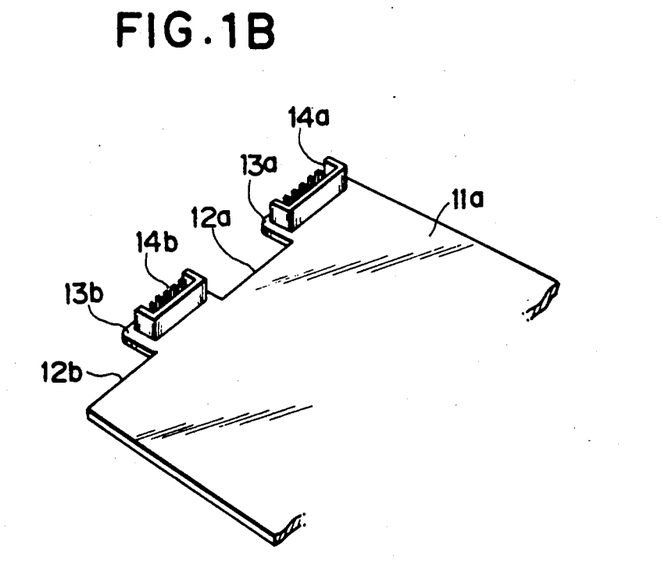
FIG. 1B is a fragmentary perspective view of the upper substrate of FIG. 1A.

FIG. 1A is a fragmentary plan view of an upper transverse substrate 11a (recited in claims as a second transverse substrate, and hereinafter called an upper substrate) used in the first embodiment of the invention, and FIG. 1B is a perspective of the upper substrate of FIG. 1A.

In FIGS. 1A and 1B, the upper substrate 11a has cutouts 12a and 12b in an intermediate portion and a corner portion along an end margin thereof. The cutouts 12a and 12b result in defining projections 13a and 13b on which upper plugs 14a and 14b in the form of convex connectors are fixed so that their coupling motion is effected perpendicularly of the substrate surface. The plugs 14a and 14b are so disposed that their center positions are distant by distance $\beta$ and distance $\gamma$ from an end of the substrate. $\beta$ is a half the width of the projection 14a, and $\gamma$ equals $3\beta$ plus the width of the cutout.

Figure 2A:
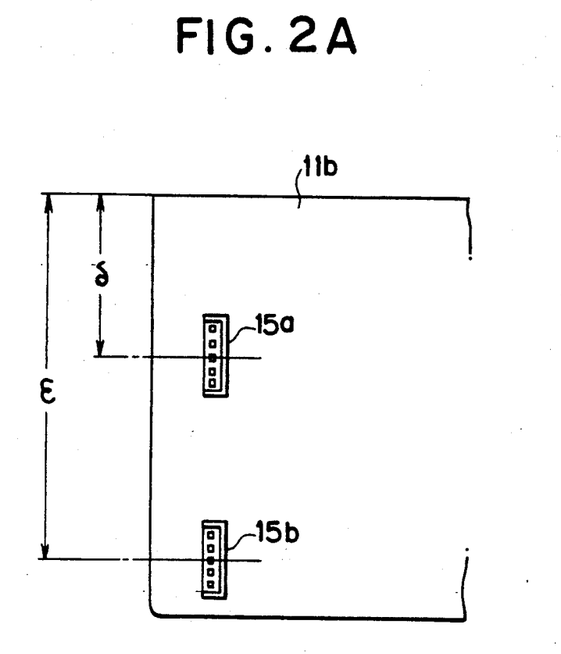
FIG. 2A is a fragmentary plan view of a lower substrate of the first embodiment.
Figure 2B:
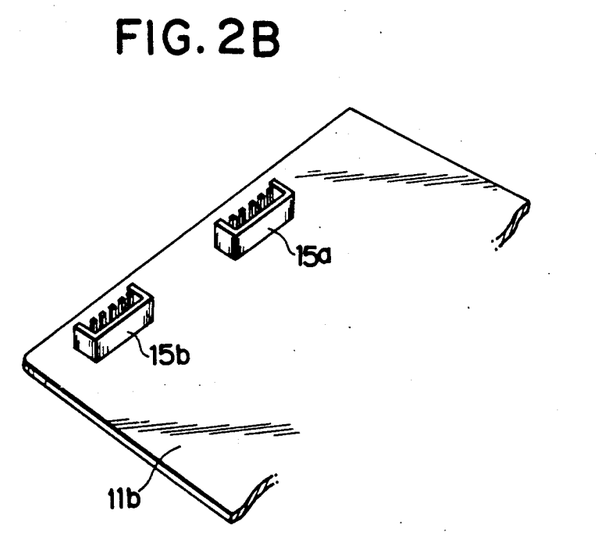
FIG. 2B is a fragmentary perspective view of the lower substrate of FIG. 2A.

Referring to FIGS. 2A and 2B, the lower transverse substrate 11b (recited in claims as a first transverse substrate, and hereinafter called a lower substrate) supports lower plugs 15a and 15b fixed thereon at positions corresponding to the cutouts 12a and 12b of the upper substrate 11a so that their coupling motion is effected perpendicularly of the substrate surface. Center positions of lower plugs 15a and 15b are distant from an end of the lower substrate 11b by distance $\delta$ and distance $\epsilon$, respectively. $\delta$ is the width of the projection plus a half the width of the cutout, and $\epsilon$ equals the width of the substrate minus a half the width of the cutout.

The distances corresponding to $\delta-\beta$, $\gamma-\delta$, $\epsilon-\gamma$ are larger than the widths of the upper plugs 14a, 14b and the lower plugs 15a and 15b.

Figure 3A:
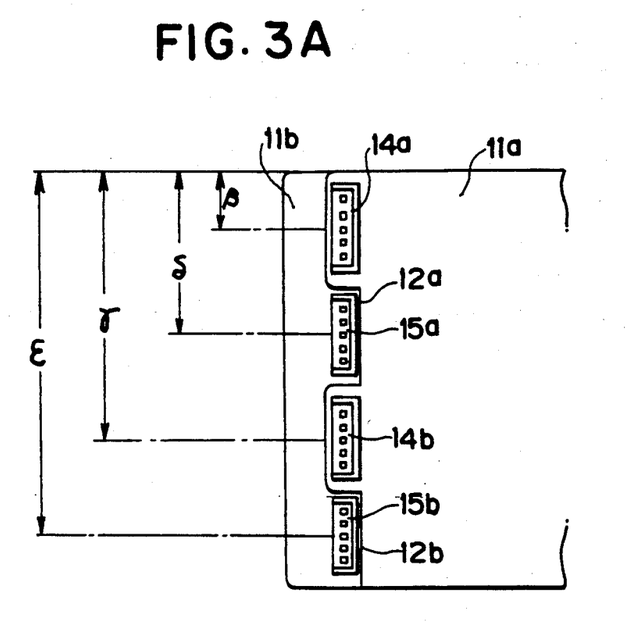
FIG. 3A is a fragmentary plan view which shows a positional relationship between the upper substrate and the lower substrate in the first embodiment.
Figure 3B:
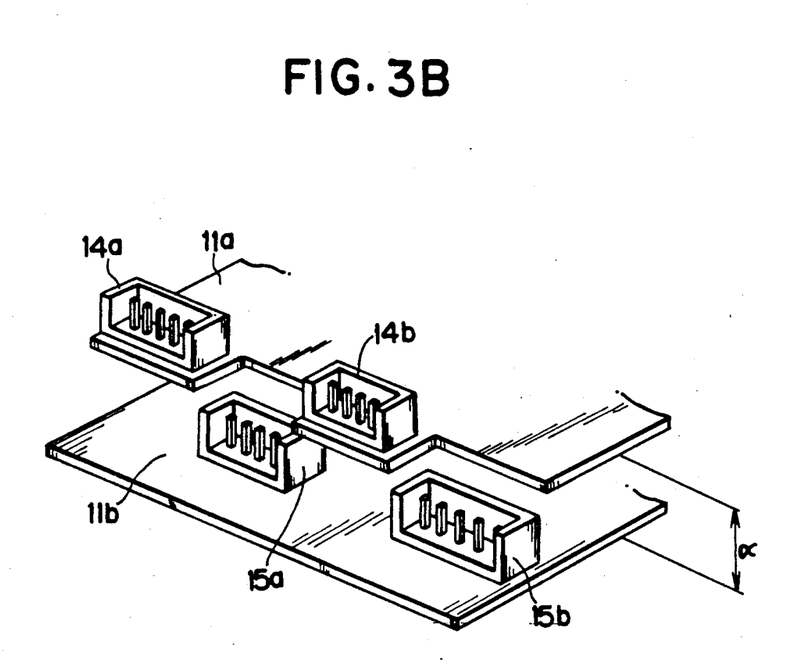
FIG. 3B is a fragmentary perspective view which shows a positional relationship between the upper substrate and the lower substrate in the same embodiment.

When the upper and lower substrates, having thereon the upper plugs 14a and 14b and the lower plugs 15a and 15b disposed as described above, are disposed in a parallel relationship as shown in FIGS. 3A and 3B, the upper plugs 14a, 14b and the lower plugs 15a and 15b are exposed upwardly and are aligned in a straight line as seen in the plan view of FIG. 3A.

Figure 4A:
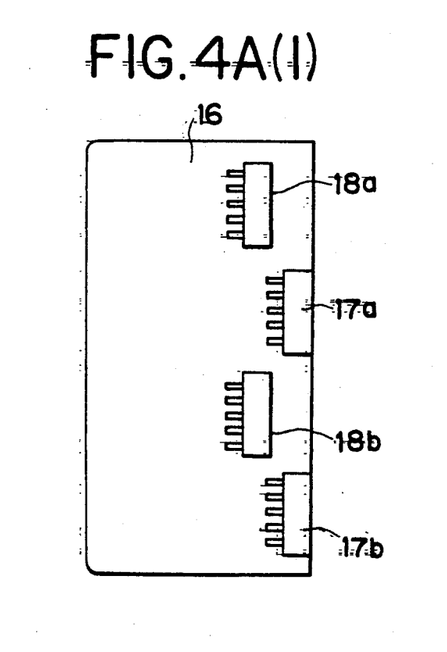
FIG. 4A is views of a vertical substrate in the first embodiment, taken from three different angles.
Figures 4A, 4B:
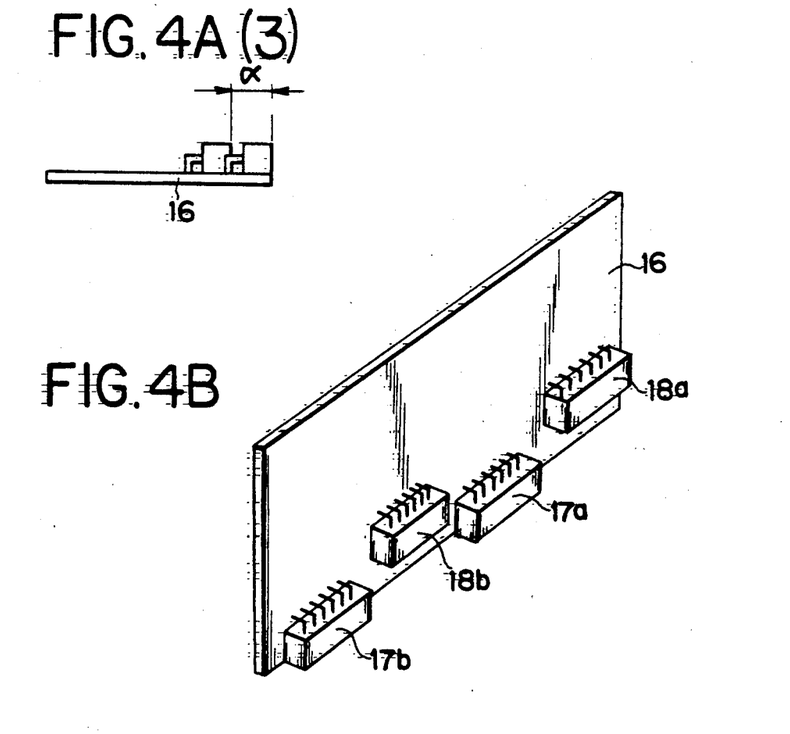
FIG. 4B is a perspective view of the vertical substrate of FIG. 4A.

FIG. 4A provides three different-angle views (plan view, side elevation and front elevation) of a longitudinal substrate 16 used in the first embodiment, and FIG. 4B is a perspective view of the longitudinal substrate 16. Referring to FIGS. 4A and 4B, the longitudinal substrate 16 supports lower sockets 17a and 17b in the form of concave connectors which are fixed to a lower end portion of the longitudinal substrate at positions $\delta$ and $\epsilon$ corresponding to the lower plugs 15a and 15b on the lower substrate 11b so that they are inserted in corresponding plugs by their movements parallel to the substrate surface. The longitudinal substrates 16 further supports upper sockets 18a and 18b which are fixed thereon at positions which are distant from the lower end thereof by a distance $\alpha$ equal to the distance between the upper and lower substrates 11a and 11b and are defined by $\beta$ and $\gamma$ corresponding to the upper plugs 14a and 14b of the upper substrate 11a.

Figure 5:
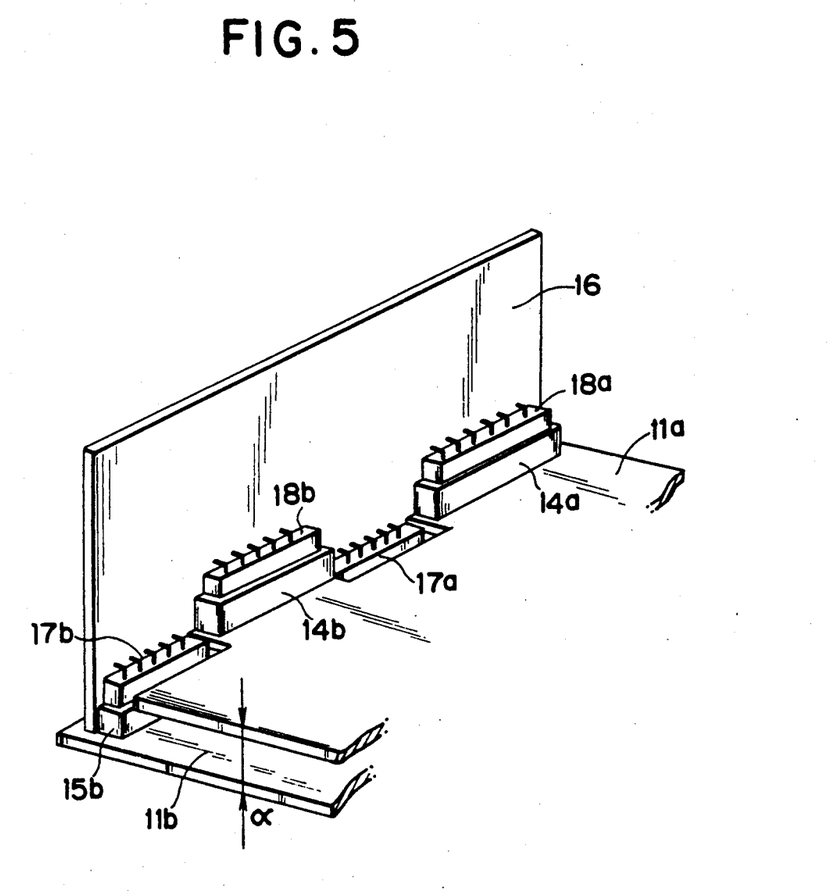
FIG. 5 is a fragmentary perspective view which shows three substrates in connection.
Figure 6:
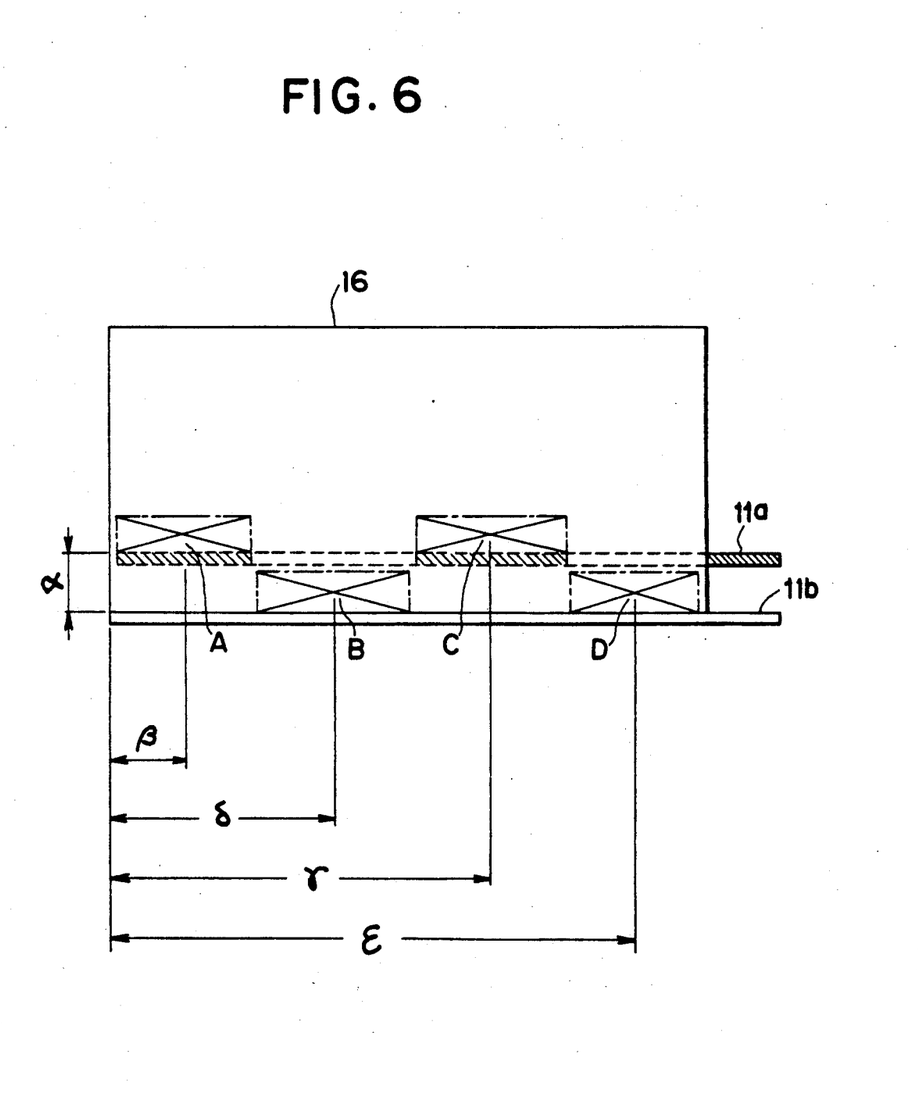
FIG. 6 is a front sight-through view which shows three substrates in connection.

When the longitudinal substrate 16 is assembled vertically downwardly to the upper and lower substrates 11a and 11b held in a two-floor relationship, with their upper plugs 14a, 14b and the lower plugs 15a and 15b being aligned in a straight line, the lower sockets 17a, 17b and the upper sockets 18a and 18b which are disposed in different stages on the same surface of the vertical substrate 16 are inserted in respective corresponding plugs as shown in FIG. 5. More specifically, as shown in FIG. 6, sockets and plugs are connected in combination of (A) 14a–18a, (B) 14b–18b, (C) 15a–17a and (D) 15b–17b.

According to the above-described embodiment of the structure for coupling a plurality of substrates, since the upper sockets 18a and 18b are automatically inserted in the upper plugs 14a and 14b, and the lower sockets 17a and 17b are automatically inserted in the lower plugs 15a and 15b, by assembling the longitudinal substrate 16 to the horizontally supported upper and lower substrates 11a and 11b, electrical connection among the substrates 11a, 11b and 16 is completed without requiring any further particular process.

Figure 7:
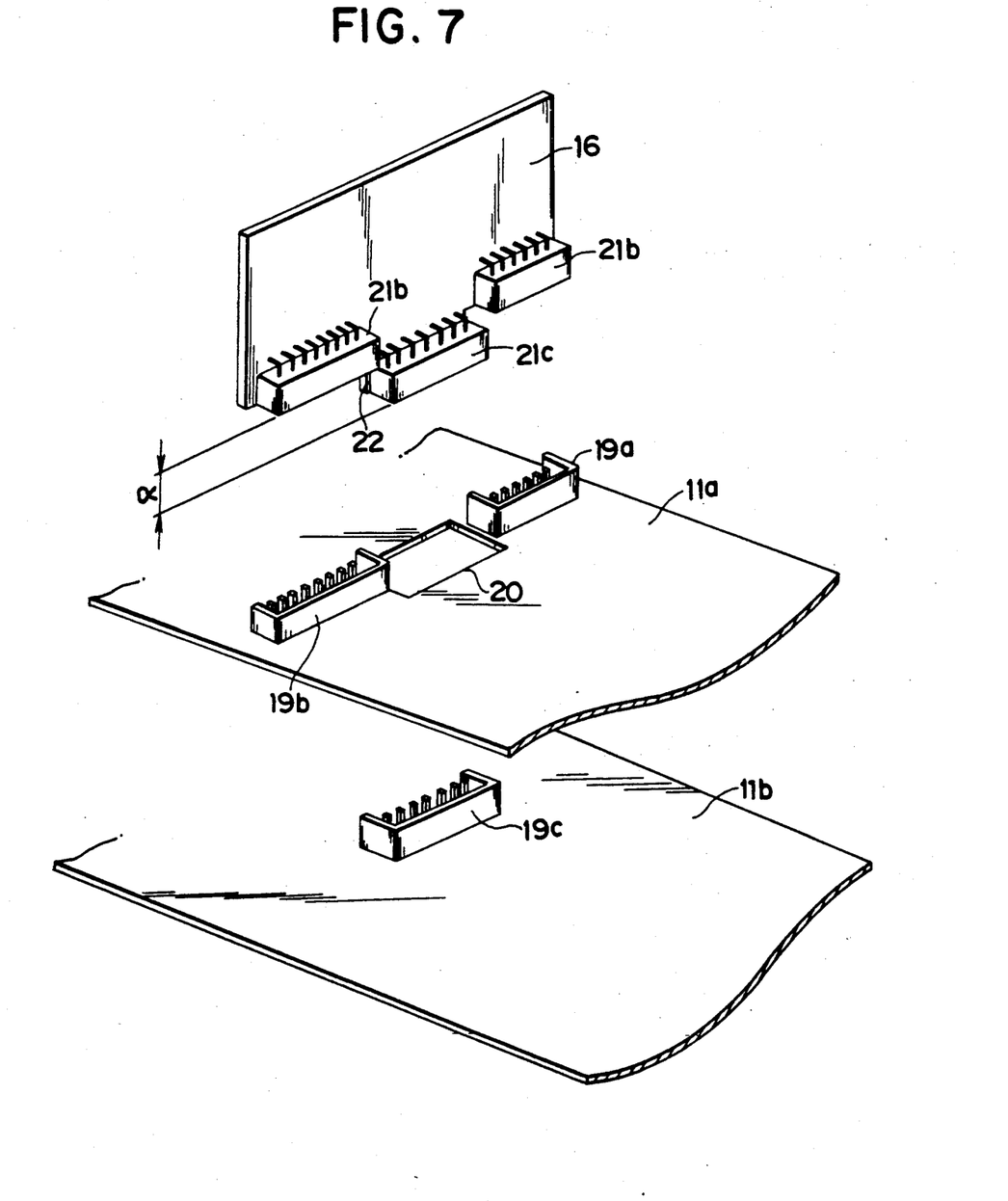
FIG. 7 is a fragmentary perspective view which shows a second embodiment of the invention.

In the substrate coupling structure according to the aforegoing embodiment, the upper plugs 14a and 14b and the lower plugs 15a and 15b are disposed at end portions of the transverse substrates 11a and 11b, respectively. However, the invention is not restricted to this embodiment, but may be arranges as shown in FIG. 7 where the longitudinal substrate 16 is assembled in central portions of the upper and lower substrates 11a and 11b. In this case, a lower plug 19c is fixed in the center of the lower substrate 11b, and the upper substrate 11a has an aperture at a position corresponding to the lower plug 19c so as to permit a coupling motion of the lower plug 19c therein. The aperture 20 has a dimension larger than the overall dimension of the lower plug 19c, and the lower plug 19c can be seen through the aperture 20 also after the upper substrate 11a is assembled above the lower substrate 11b. The upper substrate has upper plugs 19a and 19b fixed thereon at positions where they are aligned on a straight line with the lower plug 19c when the upper substrate 11a and the lower substrate 11b are assembled together. Positional relationships among the plugs 19a, 19b and 19c are determined by the parameters $\beta$, $\gamma$, $\delta$ and $\epsilon$ used in the first embodiment.

The longitudinal substrate 16 supports upper sockets 21a and 21b at opposite ends thereof along its lower end for combination with the upper plugs 19a and 19b, and supports a lower socket 21c on a projection 22 which downwardly projects by the distance α from the lower ends of the longitudinal substrate at opposite sides of the projection 22. Positional relationships among the upper and lower sockets 21a, 21b and 21c are also determined by the parameters β, γ, δ and ε used in the first embodiment.

Also in the substrate coupling structure according to the second embodiment, the upper and lower sockets 21a, 21b and 21c are provided on a single plate. Therefore, the sockets 21a, 21b and 21c are automatically inserted in the upper and lower plugs 19a, 19b and 19c by assembling the longitudinal substrate 16 with the upper and lower substrates 11a and 11b, and structural and electrical connection among the substrates is established in a single assembling process.

Figure 8:
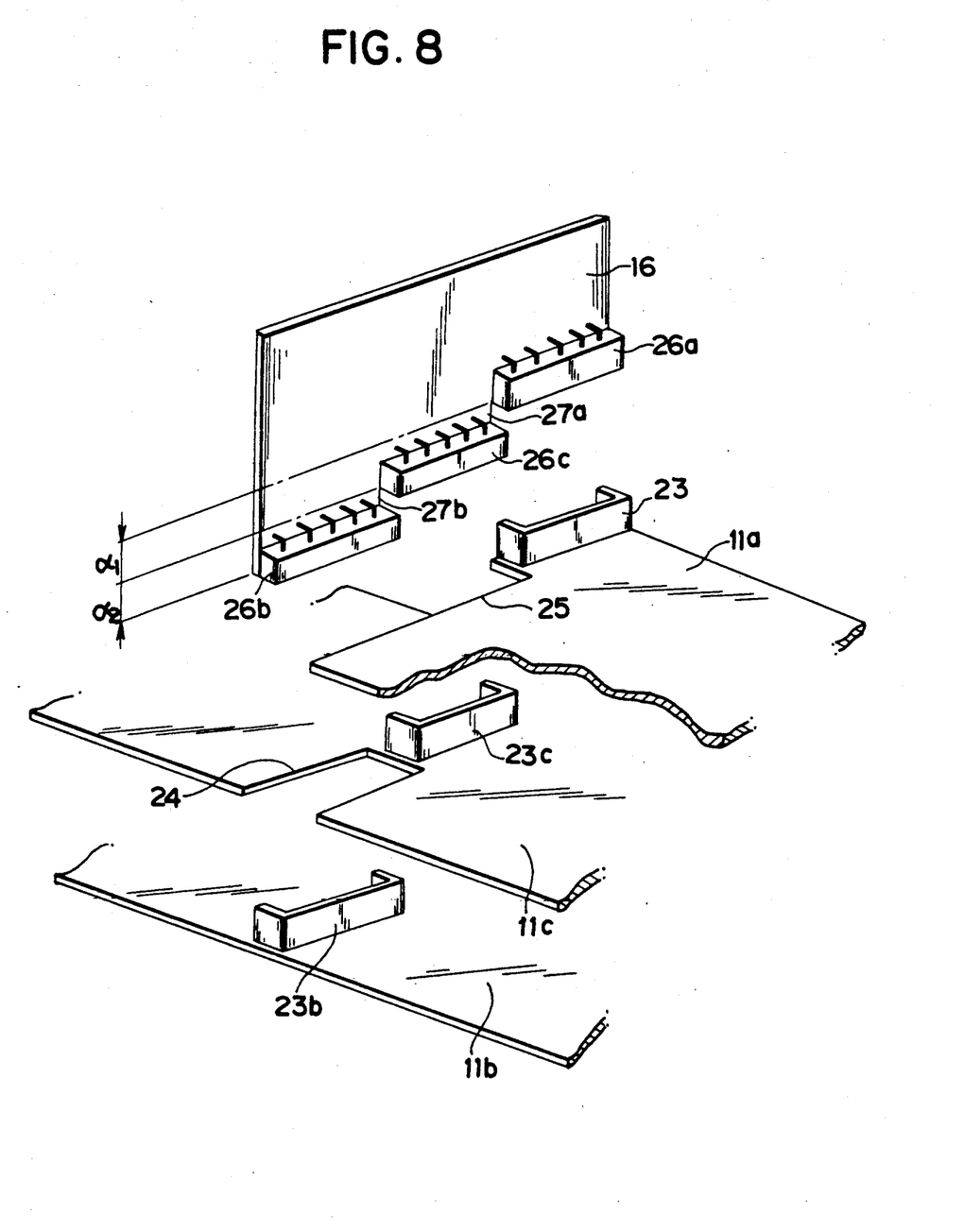
FIG. 8 is a fragmentary perspective view which shows a third embodiment of the invention.

FIG. 8 shows a structure where an intermediate substrate 11c is mounted between the upper substrate 11a and the lower substrate 11b, and a single longitudinal substrate 16 is assembled with three transverse disposed substrates 11a, 11b and 11c. The lower substrate 11b supports a lower plug 23b at a desired position, and the intermediate substrate 11c is disposed above the lower substrate 11b. The intermediate substrate 11c has a cutout 24 slightly larger than the overall dimension of the lower plug 23b at a position corresponding to the lower plug 23b. An intermediate plug 23c is disposed on the intermediate substrate 11c to form a straight line with the lower plug 23b. Above the intermediate substrate 11c is mounted the upper substrate 11a. The upper substrate 11a has a cutout 25 at a position above the lower plug 23b and the intermediate plug 23c. The lower plug 23b and the intermediate plug 23c are exposed upwardly and can be seen from the upper portion of the upper substrate 11a through the cutout 25. The upper substrate 11a also supports an upper plug 23a fixed thereon to form a straight line with the lower plug 23b and the intermediate plug 23c. On the other hand, the longitudinal substrate 16 supports an upper socket 26a at one end thereof along its lower end for connection with the upper plug 23a. Adjacent the position of the upper socket 26a is provided a projection 27a which downwardly projects from the portion of the upper plug 23a by a distance α1 corresponding to the distance between the upper substrate 11a and the intermediate substrate 11c, and an intermediate socket 26c is fixed on the projection 27a. Adjacent the portion of the intermediate socket 26c is provided a projection 27b which downwardly projects from the portion of the intermediate socket 26c by a distance α2 corresponding to the distance between the intermediate substrate 11c and the lower substrate 27b.

These four substrates can be assembled substantially in the same manner as the former embodiment.

The invention is described above as providing plugs (male couplers) on transversely disposed substrates and providing sockets (female couplers) on the longitudinally assembled substrate 16. However, this is not but an example, and should never be construed to exclude arrangements where the transverse substrates support sockets and the longitudinal substrate supports plugs, or other arrangements where plugs and sockets are supported in mixture on the same substrate.

The aforegoing description uses the words "transverse substrates" and "longitudinal substrate" for purposes of better understanding of the invention. However, transverse and longitudinal directions may be inverted in practical use of the invention.

What is claimed is:

1. A structure for coupling a plurality of substrates comprising:
    a first transverse substrate and a second transverse substrate disposed above and parallel to said first transverse substrate;
    a first transverse substrate connector fixed on an upper surface of said first transverse substrate so that a coupling motion of said first transverse substrate connector is effected in a perpendicular direction of said upper surface of said first transverse substrate;
    a cutout or aperture formed in said second transverse substrate to permit said coupling motion of said first transverse substrate connector;
    a second transverse substrate connector fixed on an upper surface of said second transverse substrate at a position aligned with said first transverse substrate connector on a line along their length direction so that a coupling motion of said second transverse substrate connector is effected in a perpendicular direction of said upper surface of said second transverse substrate;
    a longitudinal substrate to be mounted perpendicularly with respect to said first and second transverse substrates;
    a front longitudinal substrate connector fixed on an upper surface of said longitudinal substrate so that a coupling motion of said front longitudinal substrate connector is effected in a parallel direction with said upper surface of said longitudinal substrate, said front longitudinal substrate connector being coupled to said first transverse substrate connector; and
    a rear longitudinal substrate connector fixed on said upper surface of said longitudinal substrate at a position behind said front longitudinal substrate connector so that a coupling motion of said rear longitudinal substrate connector is effected in a parallel direction with said upper surface of said longitudinal substrate, said rear longitudinal substrate connector being coupled to said second transverse substrate connector.

* * * * *